United States Patent [19]

Herberg

[11] 4,419,683
[45] Dec. 6, 1983

[54] THYRISTOR HAVING A CONTROLLABLE EMITTER SHORT CIRCUIT

[75] Inventor: Helmut Herberg, Munich, Fed. Rep. of Germany

[73] Assignee: Siemens Aktiengesellschaft, Berlin & Munich, Fed. Rep. of Germany

[21] Appl. No.: 255,175

[22] Filed: Apr. 17, 1981

[30] Foreign Application Priority Data

May 14, 1980 [DE] Fed. Rep. of Germany ....... 3018542

[51] Int. Cl.³ ........................................... H01L 29/74
[52] U.S. Cl. ..................................... 357/38; 357/22; 357/39; 357/43; 307/305; 307/252 A
[58] Field of Search ................. 357/22, 38 T, 38 L, 357/38 R, 38 G, 38, 38 C, 22 RG, 43, 39; 307/252 A, 252 J, 305

[56] References Cited

U.S. PATENT DOCUMENTS

| 2,954,486 | 9/1960 | Doucette et al. | 357/51 |
|---|---|---|---|
| 3,035,186 | 5/1962 | Doucette | 357/51 |
| 3,243,669 | 3/1966 | Sah | 317/234 |
| 3,391,310 | 7/1968 | Gentry | 357/39 |
| 3,700,982 | 10/1972 | Weinstein | 357/39 |
| 3,812,405 | 5/1974 | Clark | 357/38 |
| 3,891,866 | 6/1975 | Okuhara et al. | 307/252 A |
| 4,089,024 | 5/1978 | Tanaka | 357/39 |
| 4,163,241 | 7/1979 | Hutson | 357/38 |
| 4,170,020 | 10/1979 | Sueoka et al. | 357/36 |
| 4,224,634 | 9/1980 | Svedberg | 357/39 |
| 4,295,058 | 10/1981 | Lade et al. | 357/22 |
| 4,323,793 | 4/1982 | Schutten et al. | 307/305 |

Primary Examiner—Martin H. Edlow
Assistant Examiner—Jerome Jackson
Attorney, Agent, or Firm—Hill, Van Santen, Steadman & Simpson

[57] ABSTRACT

In a thyristor, a junction field effect transistor is provided for controlling an emitter short circuit. The thyristor has an outer n-emitter, an outer p-emitter, each carrying a respective electrode, a p-base and an n-base between and respectively adjacent the emitters, and the emitter short circuit is constituted by a semiconductor zone in one of the emitters and doped opposite to that emitter and carrying a gate electrode. A portion of the emitter under the zone constitutes a channel zone for the field effect transistor, while lateral portions of the emitter constitute a source and drain.

12 Claims, 4 Drawing Figures

THYRISTOR HAVING A CONTROLLABLE EMITTER SHORT CIRCUIT

BACKGROUND OF THE INVENTION

1. Field of the Invention

The present invention relates to a thyristor having a controllable emitter short circuit in which the thyristor has a semiconductor body which contains an outer n-emitter layer carrying a cathode, an outer p-emitter layer carrying an anode and two base layers respectively adjacent thereto, and comprising a controllable emitter short circuit.

2. Description of the Prior Art

A thyristor of the type generally set forth above is known from U.S. Pat. No. 3,243,669. In that patent, the controllable emitter short circuit comprises a metal-insulator-semiconductor (MIS) structure which has a gate separated from the semiconductor body by a thin, electrically insulating layer. Upon the application of a control voltage to the gate, a short circuit path is turned on which bridges the pn junction between the emitter layer connected to the anode and the adjacent base layer. This results in the switching of the thyristor from the current-conducting condition into the blocked condition in which practically no current flows between the anode and cathode despite a voltage applied in the forward-conducting direction. What is disadvantageous is that the MIS structure is sensitive to very high gate voltages which, for example, can arise due to an undesired charging of the gate.

SUMMARY OF THE INVENTION

The object of the present invention is to provide a thyristor having a controllable emitter short circuit in which the controllable emitter short circuit is insensitive to high control voltages.

The above object is achieved in that a junction field effect transistor is provided for the control of the emitter short circuit, the junction field effect transistor comprising a semiconductor region within an emitter layer, doped oppositely to the emitter layer and provided with a gate electrode. A portion of the emitter layer lying below the semiconductor region forms the channel zone of the field effect transistor. The source and drain regions of the transistor are formed by those portions of the emitter layer adjacent in the lateral direction to the semiconductor region of which the one portion is connected to the cathode (anode), and the other portion is connected by way of a conductive coating to the base layer adjacent to the emitter layer.

An advantage which can be attained in practicing the present invention is that the junction field effect transistor is not destroyed, even given high gate voltages. Moreover, it is not required, given a thyristor constructed in accordance with the present invention, to construct a very thin, electrically insulating layer on a relatively strongly doped semiconductor layer, as is the case in the known thyristors from the aforementioned U.S. Pat. No. 2,243,669.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
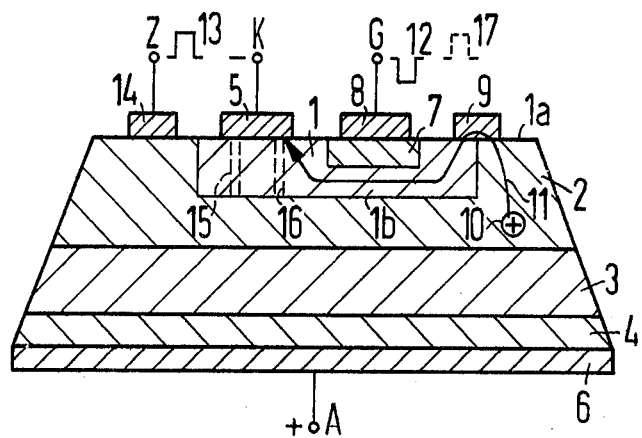
FIG. 1 is a schematic sectional rendition of a first exemplary embodiment of the invention.

A thyristor is illustrated in FIG. 1 as comprising a semiconductor body of, for example, silicon having a plurality of layers of alternating conductivity. The outer n-conductive layer 1 is designated as the n-emitter layer and the outer p-conductive layer 4 is designated as the p-emitter layer. The p-conductive layer 2, therefore, represents the p-base layer, whereas the n-conductive layer 3 represents the n-base layer. The n-emitter layer 1 is provided with a cathode 5 which carries a terminal K, whereas the p-emitter layer 4 is contacted with an anode 6 whose terminal is referenced A. A p-conductive region is located in the n-emitter layer 1, the p-conductive region 7 extending up to the upper boundary surface 1a of the semiconductor body. The region 7 is contacted with a gate 8 which is connected to a terminal G. Further, a conductive coating 9 is provided in FIG. 1 which bridges the pn junction between the layers 1 and 2 at the edges thereof. The portions of the n-emitter layer 1 illustrated in FIG. 1 to the right and left of the region 7 represent the source and drain regions of a junction field effect transistor whose gate region is formed by the region 7. The channel zone of the field effect transistor is that portion of the n-emitter layer 1 which lies below the region 7.

In the blocked condition of the thyristor in which a voltage is applied across the terminals A and K with the polarity indicated in FIG. 1, the holes 10 which, for example, are thermally generated or move in the direction of the cathode under the influence of a rapidly increasing voltage across A and K move from the p-base layer 2 by way of the conductive coating 9 and the channel zone 1b to the cathode 5, insofar as the gate terminal G is voltage-free in comparison to the cathode K or is connected to a positive voltage. The current path indicated at 11 in FIG. 1 and extending over the coating 9 and the channel zone 1 represents a so-called emitter short circuit path which shorts the p-base layer 2 with the cathode 5. Given the supply of a negative voltage of sufficient magnitude, for example, of a pulse 12, to the terminal G, the channel zone 1b is constricted by the space charge zone arising at the pn junction between the region 7 and the layer 1, so that the emitter short circuit path 11 is interrupted. Thereby, the transistor attains a condition in which it is easy to trigger. The thermally-generated holes 10 which thereby move to the pn junction between the layers 1 and 2 can already effect the triggering of the thyristor. On the other hand, the triggering can be promoted by application of a positive pulse 13, which coincides chronologically with the pulse 12, the pulse 13 being supplied to a trigger electrode 14, carried on the p-base layer 2, via a terminal Z. Holes additionally introduced into the p-base layer 2 via the trigger electrode 14 likewise arrive at the pn junction between the layers 1 and 2 and thus promote the trigger operation. After termination of the pulse 12 or of the pulses 12 and 13, the thyristor once triggered remains in the current-conducting condition. According to another operating mode of the thyristor illustrated in FIG. 1, the gate terminal G—in the blocking condition and in the current-conducting condition—is charged with a negative voltage in comparison to the terminal K, and of such a magnitude that the channel zone $1b$ is completely constricted so that the emitter short circuit 11 is interrupted. This operating mode is particularly suited for such thyristors whose n-emitter layers are provided in a manner known per se with fixed emitter short circuits which consist of approximately cylindrical projections of the p-base layer which penetrate the n-emitter layer 1 at a plurality of locations and extend up to the boundary surface $1a$, as is indicated in FIG. 1 at 15 and 16. In this case, the negative voltage at the terminal G is briefly turned off only at the time of the shut-down of the thyristor, i.e. during the transition from a current-conducting condition into a blocked condition, or is briefly compensated or over-compensated by application of a positive voltage pulse 17, so that the controllable emitter short circuit 11 is briefly switched on in order to achieve a fast blocking of the thyristor.

Figure 2:
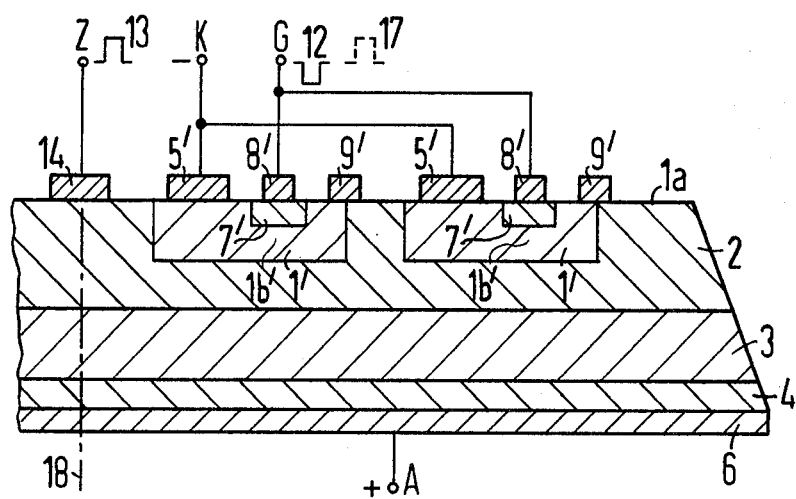
FIG. 2 is a sectional view of a preferred development of the first embodiment of the invention.

According to a preferred development of the thyristor according to FIG. 2, the emitter layer 1 is sub-divided into two-or more emitter zones $1'$ which are respectively provided with cathode portions $5'$ which, in turn, are connected to a common terminal K. Regions $7'$ located in the individual emitter zones $1'$ are respectively connected with gates $8'$ which are likewise connected to a common terminal G. Each of the pn junctions between the emitter zones $1'$ and the p-base layer 2 is bridged by a conductive coating $9'$, whereby the channel zones $1b'$ of the field effect transistors respectively lie in series to the coatings $9'$ in the short circuit paths between the p-base layer 2 and the cathode portions $5'$. The parts $1'$, $5'$, $7'$ and $9'$, respectively, advantageously exhibit a longitudinally-extended shape, whereby their dimensions perpendicular to the plane of the drawing of FIG. 2 are significantly greater than within the plane of the drawing. The trigger electrode 14 carrying the terminal Z corresponds to the parts already illustrated in FIG. 1 and is provided with the identical reference character. The format of the thyristor of FIG. 2 can be symmetrical with reference to a plane which extends through the line 18 and is perpendicular to the plane of the drawing of FIG. 2. According to another preferred embodiment, the thyristor of FIG. 2 can also have a rotational-symmetrical format in which the axis of symmetry consists of a line 18. The parts $1'$, $5'$, $7'$ and $9'$ are then respectively annularly designed.

Figure 3:
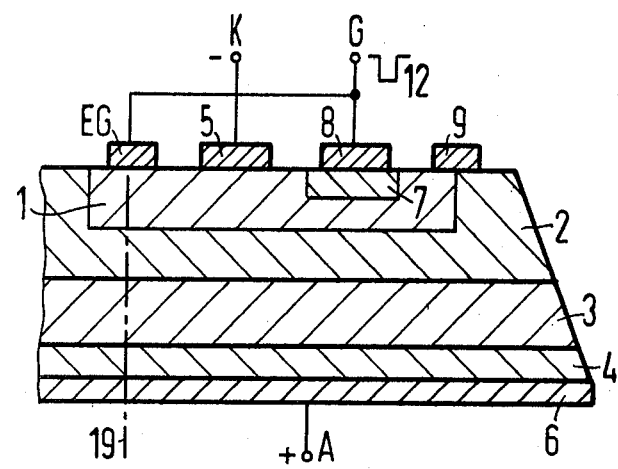
FIG. 3 is a sectional view of a second exemplary embodiment of the invention.

According to a further development of the invention, as illustrated in FIG. 3, a trigger electrode EG in the form of a so-called emitter gate can also be provided, the trigger electrode EG being carried on the n-emitter layer 1. The electrode EG can be connected to the terminal G since it requires a trigger pulse which is negative in comparison to the cathode terminal K. The pulse 12 which is negative in comparison to the cathode K thereby not only effects an interruption of the emitter short circuit path 11 (FIG. 1), but, rather also simultaneously promotes the trigger operation via the emitter gate EG. The function of such an emitter gate is known per se from the book "Thyristor Physics" by Adolf Blicher, Springer Verlag, 1976, pp. 124–126.

The structure of a thyristor according to FIG. 3 can advantageously be rotational-symmetrical with respect to an axis 19 or, given a longitudinally-extended design of the parts 1, 5 and 7–9, it can be symmetrical to a plane of symmetry extending through the line 19 and being perpendicular to the plane of the drawing of FIG. 3. Such formats have already been explained in greater detail on the basis of FIG. 2. Further, the n-emitter layer 1 can also be sub-divided into a plurality of emitter zones $1'$, given a thyristor according to FIG. 3, the emitter zones $1'$ being respectively provided with cathode portions $5'$, enclosed regions $7'$, gates $8'$ and conductive coatings $9'$, which has likewise been illustrated on the basis of FIG. 2.

Figure 4:
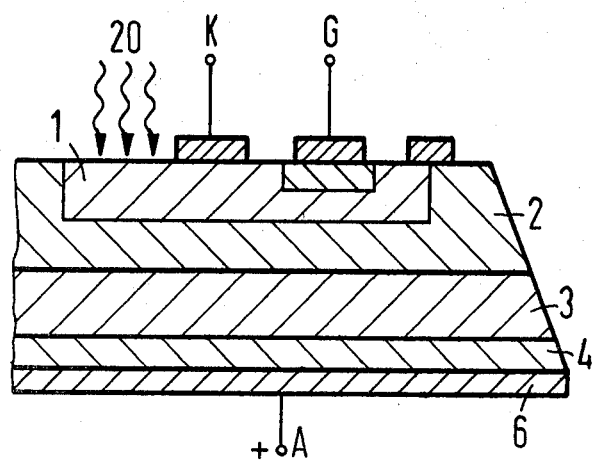
FIG. 4 is a sectional view of a third exemplary embodiment of the invention.

The exemplary embodiment of the invention illustrated in FIG. 4 differs from FIG. 1 or FIG. 3 only in that an optical triggering is indicated by the light beam 20 which is provided instead of the trigger electrode 14 or, respectively, the emitter gate EG.

Within the framework of the invention, it can also be the p-emitter layer 4 instead of the n-emitter layer 1 which is bridged by one or more controllable emitter short circuits. FIGS. 1–4 can be employed for illustrating the circuit variation when the designations of the terminals A and K are mutually interchanged and the semiconductor portions 1–4 and 7 respectively exhibit conductivity types opposite to those previously described. The pulses 12, 13 and 17, thereby, respectively exhibit the opposite operational sign. Finally, embodiments of the invention are also advantageous in which both the n-emitter layer 1 and the p-emitter layer 4 are respectively provided with one or more controllable emitter short circuits.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a semiconductor thyristor of the type wherein an outer n-emitter carries a first electrode, an outer p-emitter carries a second electrode, a p-base and an n-base are between and respectively adjacent the emitters, and a controllable emitter short circuit is provided, the improvement therein comprising:
    a junction field effect transistor for controlling the emitter short circuit, said field effect transistor comprising
    a semiconductor zone in one of the emitters doped opposite to that emitter,
    a gate electrode carried on said zone,
    a first portion of said one emitter below said zone constituting a channel zone for said field effect transistor and second and third portions of said one emitter constituting the drain and source of the field effect transistor,
    the respective electrode contacting said second portion of said one emitter, and
    a conductive coating connecting said third portion of said one emitter with the adjacent one of said bases.

2. The improved thyristor of claim 1, wherein the first electrode is a cathode and the second electrode is an anode.

3. The improved thyristor of claim 1, and further comprising:
    a trigger electrode carried on said one base.

4. The improved thyristor of claim 1, and further comprising:
   an emitter gate electrode carried on said one emitter for receiving a trigger pulse.

5. The improved thyristor of claim 4, wherein: said gate electrode and said emitter gate are connected in common.

6. The improved thyristor of claim 1, including a radiation source which is in optical contact with said one emitter for triggering.

7. The improved thyristor of claim 1, including a radiation source which is in optical contact with said one adjacent base for triggering.

8. The improved thyristor of claim 1, wherein: said one emitter is sub-divided into a plurality of emitter zones each having said first, second and third portions, a respective oppositely-doped semiconductor zone therein, a respective conductive coating, a respective gate electrode on a respective zone, and a respective emitter electrode on each of said emitter zones, said emitter electrodes connected in common and said gate electrodes connected in common.

9. The improved thyristor of claim 8, wherein: each of said emitter zones have a longitudinally-extended shape; and
   said emitter zones extend substantially parallel to one another.

10. The improved thyristor of claim 8, wherein: each of said emitter zones have a longitudinally-extended shape; and
    said emitter zones are annular and concentric.

11. In a method of operating a semiconductor thyristor of the type in which an outer n-emitter carries a first electrode, an outer p-emitter carries a second electrode, a p-base and an n-base are disposed between and respectively adjacent said emitters, and in which a controllable emitter short circuit is provided and controlled by a junction field effect transistor which comprises a semiconductor zone in and doped opposite to one of the emitters, a gate electrode carried on the zone, a first portion of the one emitter below the zone constituting a channel for the field effect transistor and second and third portions of the one emitter laterally adjacent to the zone constituting a source and a drain, in which the respective emitter electrode is carried by the source or drain portions, and in which a conductive coating contacts the one emitter and the adjacent base, the improvement therein comprising the step of:
    applying a voltage pulse to the gate electrode to switch the thyristor from the blocked condition into the current-conducting condition.

12. The improved method of claim 11, including applying a further voltage pulse to the gate to switch the thyristor from the current-conducting condition to the blocked condition by compensating a bias voltage applied to said gate which effects a blocking of the channel.

* * * * *

UNITED STATES PATENT AND TRADEMARK OFFICE
CERTIFICATE OF CORRECTION

PATENT NO. : 4,419,683

DATED : December 6, 1983

INVENTOR(S) : Helmut Herberg

It is certified that error appears in the above—identified patent and that said Letters Patent is hereby corrected as shown below:

Column 6, lines 5-30, claims 11 and 12 should be deleted.

Signed and Sealed this

Sixth Day of March 1984

[SEAL]

Attest:

GERALD J. MOSSINGHOFF

Attesting Officer

Commissioner of Patents and Trademarks